United States Patent [19]

Dowler et al.

[11] Patent Number: 4,910,117
[45] Date of Patent: Mar. 20, 1990

[54] MICROENCAPSULATED IMAGING SYSTEM EMPLOYING A METALLIZED BACKING

[75] Inventors: James A. Dowler, Franklin; Chuan Lee, Centerville; Joseph G. O'Connor, Springboro; Edward J. Saccocio, Bellbrook, all of Ohio

[73] Assignee: The Mead Corporation, Dayton, Ohio

[21] Appl. No.: 310,033

[22] Filed: Feb. 10, 1989

Related U.S. Application Data

[63] Continuation of Ser. No. 77,846, Jul. 27, 1987, abandoned.

[51] Int. Cl.⁴ ............................ G03C 1/72; B41M 5/22
[52] U.S. Cl. ..................................... 430/138; 430/211; 430/275; 430/228; 430/524; 503/214; 503/215; 428/402.2; 428/402.22
[58] Field of Search ............... 430/138, 211, 275, 278, 430/496, 221, 222, 235, 538, 524; 503/214, 215; 428/402.2, 402.22

[56] References Cited

U.S. PATENT DOCUMENTS

| | | | |
|---|---|---|---|
| 2,791,504 | 12/1952 | Plambeck, Jr. ..................... | 430/278 |
| 3,701,663 | 10/1969 | Kondo et al. ...................... | 430/496 |
| 4,210,712 | 7/1980 | Munger et al. ..................... | 430/278 |
| 4,399,209 | 8/1983 | Sanders et al. ..................... | 430/211 |
| 4,419,438 | 12/1983 | Etoh et al. ......................... | 430/278 |
| 4,440,846 | 4/1984 | Sanders et al. ..................... | 430/138 |
| 4,501,809 | 2/1985 | Hirashi et al. ...................... | 430/138 |

Primary Examiner—Paul R. Michl
Assistant Examiner—Patrick A. Doody
Attorney, Agent, or Firm—Thompson, Hine and Flory

[57] ABSTRACT

A photosensitive material comprising a support having a layer of microcapsules on the surface thereof, said microcapsules containing a color precursor and a photohardenable or photosoftenable composition, and said support being a highly reflective, non-difuse polymeric film or coated paperstock.

9 Claims, 1 Drawing Sheet

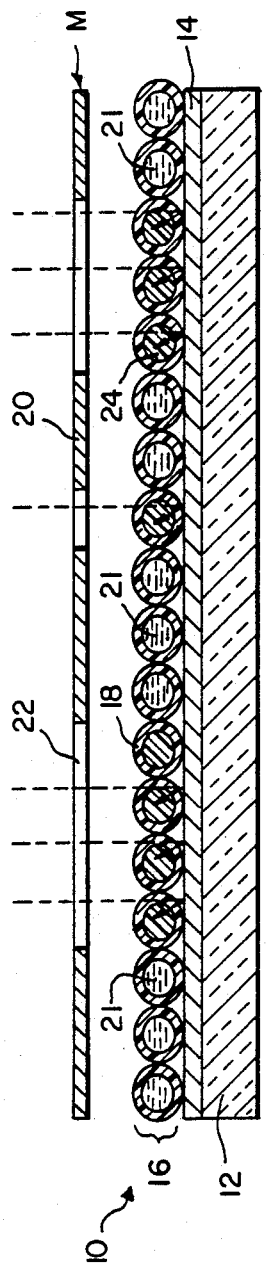

MICROENCAPSULATED IMAGING SYSTEM EMPLOYING A METALLIZED BACKING

This is a continuation of co-pending application Ser. No. 077,846 filed July 27, 1987 now abandoned.

BACKGROUND OF THE INVENTION

The present invention relates to an improvement in the imaging systems described in U.S. Pat. Nos. 4,399,209 and 4,440,846 wherein a highly reflective, non-diffusive, polymeric film or highly reflective non-diffusive coated paper stock is employed to improve sensitivity.

U.S. Pat. Nos. 4,399,209 and 4,440,846 describe imaging materials and processes wherein microcapsules containing a photohardenable or photosoftenable composition and a color precursor are image-wise exposed to actinic radiation such that, when ruptured, they differentially release the color precursor. The color precursor reacts with a developer to produce a visible color image.

One of the shortcomings of this imaging system is that it provides relatively low film speed particularly when compared to silver halide systems. Film speeds on the order to 100 to 1000 ergs/cm$^2$ are typical.

SUMMARY OF THE INVENTION

The principal object of the present invention is to provide imaging materials as described in U.S. Pat. No. 4,399,209 and 4,440,846 having improved film speed. This objective is accomplished in accordance with the present invention by employing a highly reflective non-diffusive polymeric film or highly reflective non-diffusive coated paper stock as a support for the photosensitive microcapsules. Conventionally, photosensitive microcapsules have been coated on non-reflective substrates such as transparent films and paper. It has been found, however, that a substantial amount of actinic radiation passes through the layer of microcapsules, is not absorbed by the photosensitive composition and, hence, does not take part in the imaging process. By employing a metallized polymeric film or a highly reflective, non-diffusive coated paper stock as the backing in place of previous low reflective diffusive materials, non-absorbed radiation passing through the microcapsule layer is reflected back into the microcapsule layer where it can be absorbed and thus perform additional imaging chemistry. Improvements of 1 to 2 f-stops have been achieved using the reflective backings of the present invention.

U.S. Pat. No. 4,501,809 to Havashi et al discloses an imaging material employing photosensitive microcapsules wherein, among other materials, the microcapsules may be coated on a metal foil. Metal foil per se, however, is not desirable for use as a reflective substrate because it is extremely susceptible to creases and it is very difficult to handle. Handleability is extremely critical in these materials since the sheet carrying the microcapsules and a developer sheet must be fed through a pair of pressure rollers to develop the image and creases or the like in the sheets will result in defects in the image. In accordance with the present invention metallized polymeric films are used as a reflective backing. These films, as contrasted with metal foils, can be more easily handled without creasing and are more easily processed.

DETAILED DESCRIPTION OF THE INVENTION

U.S. Pat. Nos. 4,399,209 and 4,440,846 are incorporated herein by reference. A preferred photosensitive composition for use in the present invention includes an ionic dye-reactive counter ion compound as a photoinitiator and is diclosed in published European Patent Application Publication No.0223587 Al. A preferred developer composition is a finely divided coalescable thermoplastic developer resin as described in U.S. application Ser. No. 905,727, filed September 9, 1986. Typical examples of highly reflective polymeric supports for use herein are metallized Mylar (PET), Kynar (polyvinylidenefluoride). Useful metals are Al, TiO$_2$, Ag, SnO$_2$, etc.

The term "highly reflective" as used herein means that the film reflects as least 60%, preferably at least 80% and most preferably at least 90%. High reflectance can also be achieved using smooth filled, coated and pressed paper. Smooth, metallized papers may also be used.

In addition to being highly reflective, the supports of the present invention are also characterized in that they are highly specular or essentially non-diffusive.

The invention is illustrated in more detail in the Figure which is a cross-section through an imaging sheet 10 upon exposure through a mask element M. The imaging sheet includes a transparent polymeric support 12 which carries a layer of a reflective metal 14. The metal layer 14 is overcoated on surface 15 with a layer 16 of photohardenable microcapsules 18. (photosoftenable capsules could also be used) in the unexposed areas corresponding to the darkened portions 20 of the mask M, the internal phase 21 of the microcapsules remains liquid as described in more detail in U.S. Pat. No. 4,399,209. In the exposed areas, corresponding to the transparent portions 22 of mask M, the internal phase 24 is hardened. In these areas, radiation represented by the arrows passes through the microcapsules 18 and is reflected from metal layer 14 back into the microcapsules 18. Only a portion of the radiation is absorbed on the initial pass through the microcapsules. A substantial amount of the radiation is not absorbed. By reflecting this radiation back through the microcapsules 18 in a second pass or in multiple passes as the radiation is reflected between the mirocapsule layer and the reflective layer, film speed is improved. In another embodiment the microcapsule may be coated on surface 17 instead of surface 15. Exposure is made from the microcapsule side and radiation passing through the layer 16 passes through the support 12 and is reflected back through the support to the layer 16.

The improvement in film speed achieved in the present invention is illustrated by the following example.

EXAMPLE 1

Capsule Preparation

1. Into a 600 ml stainless steel beaker, 110 g water and 4.6 g isobutylene maleic anhydride copolymer (dry) are weighed.

2. The beaker is clamped in place on a hot plate under an overhead mixer. A six-bladed, 45° pitch, turbine impeller is used on the mixer.

3. After thoroughly mixing, 4.0 g pectin (polygalacturonic acid methyl ester) is slowly sifted into the beaker.

This mixture is stirred for 2 hours at room temperature (800–1200 rpm).

4. The pH is adjusted to 7.0 with 20% sulfuric acid.

5. The mixer is turned up to 3000 rpm and the internal phase is added over a period of 10–15 seconds. Emulsification is continued for 10 minutes. Magenta and yellow precursor phases are emulsified at 25°–30° C. Cyan phase is emulsified at 45°–50° C. (oil), 25°–30° C. (water).

6. At the start of emulsification, the hot plate is turned up so heating continues during emulsification.

7. After 10 minutes, the pH is adjusted to 8.25 with 20% sodium carbonate, the mixing speed is reduced to 2000 rpm, and a solution of melamine-formaldehyde prepolymer is slowly added which is prepared by dispersing 3.9 g melamine in 44 g water, adding 6.5 g formaldehyde solution (37%) and heating at 60° C. until the solution clears plus 30 minutes.

8. The pH is adjusted to 6.0, the beaker is covered with foil and placed in a water bath to bring the temperature of the preparation to 65° C. When 65° C. is reached, the hot plate is adjusted to maintain this temperature for a two hour cure time during which the capsule walls are formed.

9. After curing, mixing speed is reduced to 600 rpm, formaldehyde scavenger solution (7.7 g urea and 7.0 g water) is added and the solution was cured another 40 minutes.

10. The pH is adjusted to 9.5 using a 20% NaOH solution and stirred overnight at room temperature.

Three batches or microcapsules were prepared as above for use in a full color imaging sheet using the three internal phase compositions set forth below.

| Yellow Forming Capsules (420 nm) | |
|---|---|
| TMPTA | 35 g |
| DPHPA | 15 g |
| 3-thenoyl-7-diethylamino coumarin | 15 g |
| 2-Mercaptobenzoxazole (MBO) | 2.0 g |
| 2,6-Diisopropylaniline | 1.0 g |
| Reakt Yellow (BASF) | 5.0 g |
| N-100 (Desmodur Polyisocyanate Resin) | 3.33 g |
| Magenta Forming Capsules (550 nm) | |
| TMPTA | 50 g |
| 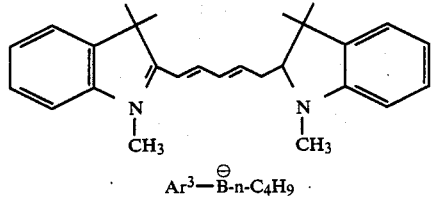 $Ar_3$—$\overset{\ominus}{B}$-n-$C_4H_9$ | 0.2 g |
| 2,6-Diisopropylaniline | 2.0 g |
| HD5100 (Magenta color precursor from Hilton-Davis Chemical Co.) | 12.0 g |
| Cyan Forming Capsules (650 nm) | |
| TMPTA | 50 g |
| 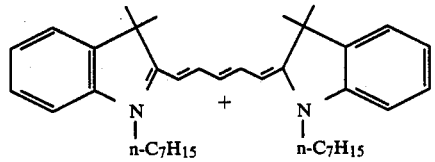 $Ar_3B^-$-n-$C_6H_{13}$ | 0.31 g |
| 2,6-diisopropylaniline | 2.0 g |
| Cyan Precursor (CP-177 of Hilton-Davis Chemical Co.) | 6 g |

The three batches of microcapsules were blended together and coated (hand draw down No. 14 bar) on support to provide imaging sheets.

One support was aluminized PET, the other (the control) was plain (un-metallized) PET. The sheets were exposed to red, green and blue light through a stepwedge under identical conditions and developed by subjecting them to pressure in contact with a developer sheet to produce cyan, magenta and yellow images. The sheet prepared using the aluminized support provided higher film speeds as shown in the following table.

TABLE

| Image | Shoulder speed Improvement | Toe speed Improvement |
|---|---|---|
| Cyan | 2.11 steps | 3.05 steps |
| Magenta | 2.23 steps | 2.24 steps |
| Yellow | 2.12 steps | 2.5 steps |

(3 steps = 1f stop)

Resolution also improved. The control gave resolution of 22/p/mm while the aluminized support gave 32.0 lp/mm.

Having described the invention in detail and by reference to preferred embodiments thereof, it will be apparent that modifications and variations are possible without departing from the scope of the invention defined in the appended claims.

What is claimed is:

1. A photosensitive material comprising a support having a layer of microcapsules on the surface thereof, said microcapsules containing a color precursor and a photohardenable composition, and said support being a highly reflective, non-diffuse polymeric film or coated paperstock; and said material being designed to be used in a process in which said photosensitive material is image-wise exposed to actinic radiation, assembled with a separate developer sheet and subjected to pressure to rupture said microcapsules and image-wise transfer said color precursor to said developer sheet to thereby form an image on said developer sheet.

2. The photosensitive material of claim 1 wherein said support is a metallized polymeric film.

3. The photosensitive material of claim 2 wherein said metallized polymeric film is metallized polyethylene terephthalate.

4. The photosensitive material of claim 2 wherein said metal is aluminum.

5. The photosensitive material of claim 1 wherein said support is highly reflective polyvinylidene fluoride.

6. The photosensitive material of claim 1 wherein said support is a filled paper.

7. The photosensitive material of claim 2 wherein said metal is selected from the group consisting of $TiO_2$, Ag and $SnO_2$.

8. The photosensitive material of claim 7 wherein said metal is $TiO_2$.

9. A process for forming an image which comprises image-wise exposing a photosensitive material comprising a support having a layer of microcapsules on the surface thereof, said microcapsules containing a color precursor and a photohardenable composition, and said support being a highly reflective, non-diffuse polymeric film or coated paperstock; assembling said image-wise exposed photosensitive material with a separate developer sheet; and subjecting said assembly to pressure to rupture said microcapsules and to cause said color precursor to be image-wise transferred to said developer sheet to form an image on said developer sheet.

* * * * *